US012604430B2

(12) United States Patent (10) Patent No.: US 12,604,430 B2
How et al. (45) Date of Patent: Apr. 14, 2026

(54) SYSTEMS FOR INTEGRATING CHOKE INTO INVERTER HEADER SUB-ASSEMBLY FOR IMPROVING EMC PERFORMANCE

(71) Applicant: BorgWarner US Technologies LLC, Wilmington, DE (US)

(72) Inventors: Jun Jie How, Singapore (SG); Kin Yean Chow, Singapore (SG); Edmund Lim, Singapore (SG); HongJun Luo, Singapore (SG); Yew Ming Chong, Singapore (SG)

(73) Assignee: BorgWarner US Technologies LLC, Wilmington, DE (US)

( * ) Notice: Subject to any disclaimer, the term of this patent is extended or adjusted under 35 U.S.C. 154(b) by 191 days.

(21) Appl. No.: 18/494,390

(22) Filed: Oct. 25, 2023

(65) Prior Publication Data

US 2025/0088097 A1 Mar. 13, 2025

Related U.S. Application Data

(60) Provisional application No. 63/582,185, filed on Sep. 12, 2023.

(51) Int. Cl.
*H05K 7/14* (2006.01)
*H02K 5/22* (2006.01)
*H02K 5/24* (2006.01)

(52) U.S. Cl.
CPC ......... *H05K 7/14322* (2022.08); *H02K 5/225* (2013.01); *H02K 5/24* (2013.01)

(58) Field of Classification Search
CPC ....... H02K 5/225; H02K 5/24; H05K 7/14322
See application file for complete search history.

(56) References Cited

U.S. PATENT DOCUMENTS

| | | | |
|---|---|---|---|
| 4,212,510 A | 7/1980 | Ritchie et al. |
| 4,296,390 A | 10/1981 | Vanderheyden et al. |
| 4,519,664 A | 5/1985 | Tillotson |
| 5,461,351 A | 10/1995 | Shusterman |
| 5,509,825 A | 4/1996 | Reider et al. |
| 5,630,734 A | 5/1997 | Phillips, Jr. |

(Continued)

FOREIGN PATENT DOCUMENTS

| | | | | |
|---|---|---|---|---|
| CN | 1267124 A | 9/2000 | |
| CN | 116613564 A | * 8/2023 | ............. H02K 5/225 |
| WO | 0221639 A1 | 3/2002 | |

*Primary Examiner* — Jue Zhang
(74) *Attorney, Agent, or Firm* — Joshua M. Haines; Bookoff McAndrews, PLLC

(57) ABSTRACT

An inverter assembly may include a housing with a base and side walls, wherein one of the side walls includes an opening extending through the wall, and wherein the side walls form a periphery around an interior of the housing. An inverter assembly may include a header with a body, the body having a first end and a second end, wherein the body further includes a flange disposed between the first end and the second end, and wherein a portion of the body extends through the opening such that the flange abuts the side wall. An inverter assembly may include a bracket positioned within the interior of the housing and coupled to the housing. An inverter assembly may include a choke that is fully enclosed in a circumferential direction, wherein the choke is positioned within the bracket and against an inner surface of the bracket facing the opening.

19 Claims, 5 Drawing Sheets

(56)         References Cited

U.S. PATENT DOCUMENTS

| | | | |
|---|---|---|---|
| 5,647,768 | A | 7/1997 | Messuri et al. |
| 6,152,775 | A | 11/2000 | Pavlovic |
| 6,234,843 | B1 | 5/2001 | Pavlovic |
| 6,623,275 | B1 | 9/2003 | Pavlovic et al. |
| 6,739,885 | B2 | 5/2004 | Ward et al. |
| 6,837,732 | B2 | 1/2005 | Pavlovic et al. |
| 2003/0162444 | A1 | 8/2003 | Hayashi |
| 2008/0233801 | A1 | 9/2008 | Johannes |
| 2017/0063203 | A1 | 3/2017 | Doo |
| 2017/0182896 | A1 | 6/2017 | Masip |

* cited by examiner

SYSTEMS FOR INTEGRATING CHOKE INTO INVERTER HEADER SUB-ASSEMBLY FOR IMPROVING EMC PERFORMANCE

CROSS-REFERENCE TO RELATED APPLICATION(S)

This application claims the benefit of priority to U.S. Provisional Patent Application No. 63/582,185, filed Sep. 12, 2023, the entirety of which is incorporated by reference herein.

TECHNICAL FIELD

Various embodiments of the present disclosure relate generally to systems for an inverter in an electric vehicle, and more particularly, to systems for improving electromagnetic compatibility (EMC) performance.

INTRODUCTION

A variety of electromagnetic compatibility (EMC) or electromagnetic interference (EMI) tests are conducted during the manufacturing process of an electric vehicle (EV) to ensure the EV meets industry standards. EVs are designed in such a way that the EV is safe for use and passes the EMC/EMI testing. Improving durability and reducing vibration are also important to consider in EV systems. However, current designs for the header of a traction inverter not only provide much lower EMC performance than expected and, consequently, fail EMC/EMI tests, but also have unreliable couplings that are prone to cracking.

The present disclosure is directed to overcoming one or more of these above referenced challenges.

SUMMARY OF THE DISCLOSURE

In some aspects, the techniques described herein relate to an inverter assembly including: a housing having a base and a plurality of side walls extending away from the base, wherein a first side wall of the plurality of side walls includes an opening extending through the first side wall, and wherein the plurality of side walls form a periphery around an interior of the housing; a header with a body, the body having a first end and a second end, wherein the body further includes a flange disposed between the first end and the second end, and wherein a portion of the body extends through the opening such that the flange abuts the first side wall; a bracket positioned within the interior of the housing, and wherein the bracket is coupled to an inner surface of the housing; and a choke, wherein the choke is positioned within the bracket and against an inner surface of the bracket facing the opening, and wherein the choke is fully enclosed in a circumferential direction.

In some aspects, the techniques described herein relate to an inverter assembly, wherein the choke has an enclosed channel extending through the choke.

In some aspects, the techniques described herein relate to an inverter assembly, wherein the coupling between the bracket and the inner surface of the housing includes a seal.

In some aspects, the techniques described herein relate to an inverter assembly, wherein the bracket is coupled to the inner surface of the housing at more than one location.

In some aspects, the techniques described herein relate to an inverter assembly, wherein each coupling is coupled by an M4 screw.

In some aspects, the techniques described herein relate to an inverter assembly, wherein the inverter assembly further includes a spacer that is disposed between the header and the choke, and wherein the spacer is fully enclosed in the circumferential direction.

In some aspects, the techniques described herein relate to an inverter assembly, wherein the spacer includes a foam material.

In some aspects, the techniques described herein relate to an inverter assembly, wherein the spacer has an enclosed channel extending through the spacer.

In some aspects, the techniques described herein relate to an inverter assembly, wherein the spacer directly contacts the header and the choke.

In some aspects, the techniques described herein relate to an inverter assembly, wherein the choke is fixed relative to the housing, header, bracket, and spacer.

In some aspects, the techniques described herein relate to an inverter assembly, wherein the spacer is fixed relative to the housing, header, bracket, and choke.

In some aspects, the techniques described herein relate to an inverter assembly, wherein the choke has an enclosed channel extending through it and the spacer has an enclosed channel extending through it such that the enclosed channel of the choke and the enclosed channel of the spacer are in communication with one another.

In some aspects, the techniques described herein relate to an inverter assembly, wherein the choke has an enclosed channel extending through it, the spacer has an enclosed channel extending through it, and the bracket has a channel extending through it such that the enclosed channel of the choke, the enclosed channel of the spacer, and the channel of the bracket are in communication with one another.

In some aspects, the techniques described herein relate to an inverter assembly, wherein wiring extends from the header through the enclosed channel of the choke, the enclosed channel of the spacer, and the channel of the bracket.

In some aspects, the techniques described herein relate to an inverter assembly, wherein the choke is a ferrite choke.

In some aspects, the techniques described herein relate to an inverter including: a housing having a base and a plurality of side walls extending away from the base, wherein a first side wall of the plurality of side walls includes an opening extending through the first side wall, and wherein the plurality of side walls form a periphery around an interior of the housing; a header with a body, the body having a first end and a second end, wherein the body further includes a flange disposed between the first end and the second end, and wherein a portion of the body extends through the opening such that the flange abuts the first side wall; a bracket positioned within the interior of the housing, and wherein the bracket is coupled to an inner surface of the housing; a choke, wherein the choke is positioned within the bracket and against an inner surface of the bracket facing the opening, and wherein the choke is fully enclosed in a circumferential direction; and power electronics configured to convert direct current to alternating current.

In some aspects, the techniques described herein relate to an inverter, wherein the choke is a ferrite choke.

In some aspects, the techniques described herein relate to an inverter, wherein the inverter further includes a spacer that is disposed between the header and the choke, and wherein the spacer is fully enclosed in the circumferential direction.

In some aspects, the techniques described herein relate to an inverter, wherein the choke has an enclosed channel extending through it, the spacer has an enclosed channel extending through it, and the bracket has a channel extending through it such that the enclosed channel of the choke, the enclosed channel of the spacer, and the channel of the bracket are in communication with one another.

In some aspects, the techniques described herein relate to an inverter, wherein wiring extends from the header through the enclosed channel of the choke, the enclosed channel of the spacer, and the channel of the bracket such that the wiring connects the power electronics.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of +10% in the stated value. In this disclosure, unless stated otherwise, any numeric value may include a possible variation of +10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section.

Since a traction inverter converts a direct current (DC) input into an alternating current (AC) output, there can be a relatively large amount of EMI generated. Specifically, areas that are poorly shielded, such as headers connecting electrical components to one another, can produce enough EMI to severely degrade EMC performance. Embodiments of the present disclosure have improved EMC performance relative to low-voltage application headers that are directly fastened to the inverter housing with plastite screws, or any other kind of fastener. Furthermore, embodiments of the present disclosure have better EMC performance than systems without an EMI shield provided for the header. One or more embodiments of the present disclosure include a choke to reduce EMI and improve EMC performance. Preferably, the choke is a ferrite choke.

Embodiments of the present disclosure may reduce the complexity of the manufacturing process by integrating the choke with the header into a header sub-assembly. Machine screws may be used to fasten to the inverter's housing instead of plastite screws, improving the robustness of the header connection. Thus, embodiments of this disclosure may provide low-cost manufacturing assemblies for an inverter that solves one or more of the aforementioned problems with current assemblies. One or more embodiments may include a spacer between the header and choke to further improve robustness, and may also include a bracket inside of the inverter housing to contain the subassembly components.

Figure 1:
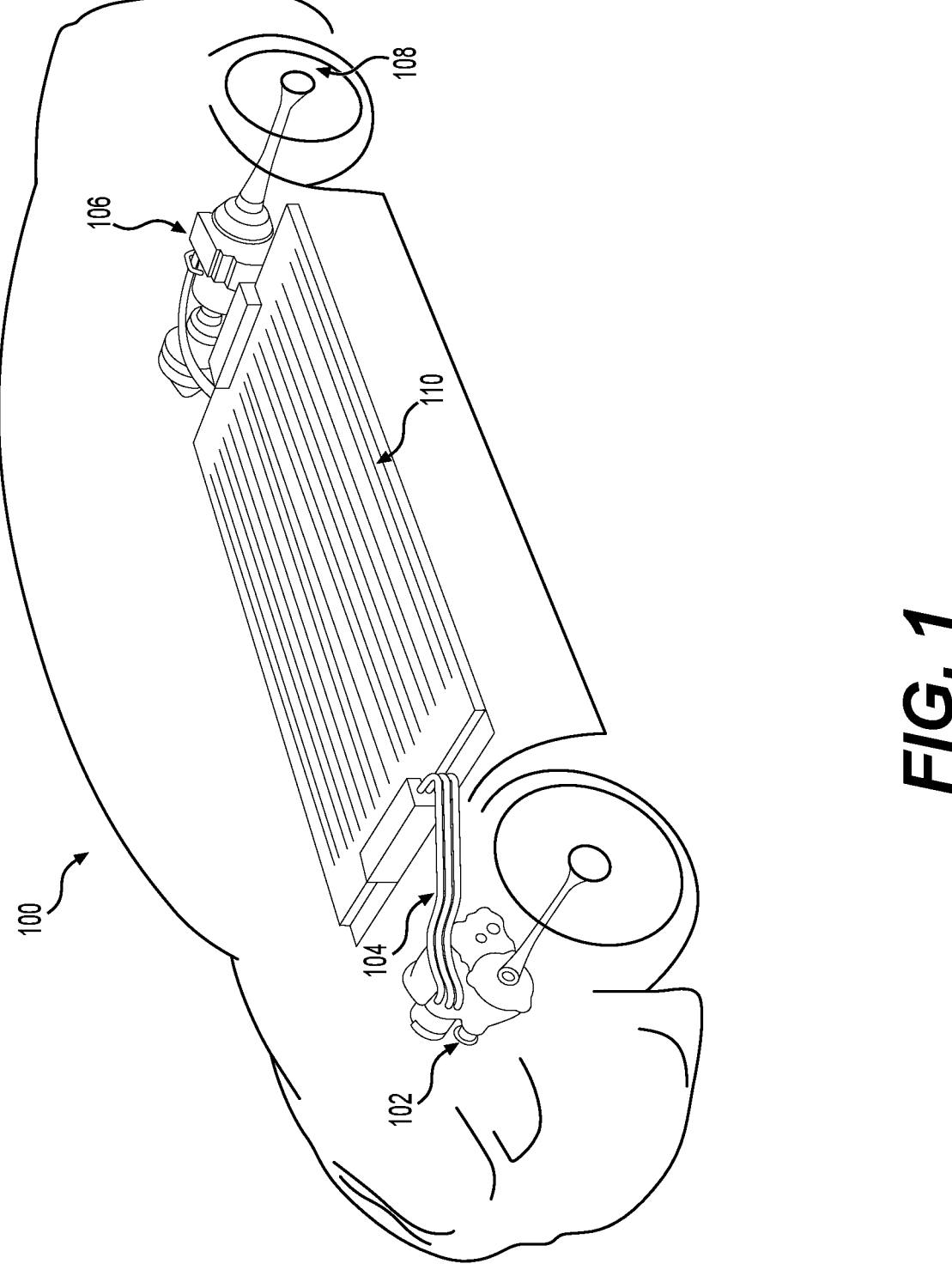
FIG. 1 depicts an exemplary system infrastructure for a vehicle including a traction inverter, according to one or more embodiments.

FIG. 1 depicts an exemplary system infrastructure for a vehicle including a traction inverter, according to one or more embodiments.

Electric vehicle 100 may include traction inverter 102, connectors 104, drive motor 106, wheels 108, and battery 110. Connectors 104 may connect the traction inverter 102 and battery 110. Traction inverter 102 may include components to receive electrical power from an external source and output electrical power to charge battery 110 of electric vehicle 100. Traction inverter 102 may convert DC power from battery 110 in electric vehicle 100 to AC power, to power the drive motor 106 and wheels 108 of electric vehicle 100, for example, but the embodiments are not limited thereto. The traction inverter 102 may be bidirectional, and may convert DC power to AC power, or convert AC power to DC power, such as during regenerative braking, for example. Traction inverter 102 may be a single-phase inverter, or a multi-phase inverter, such as a three-phase inverter, for example.

Figure 2:
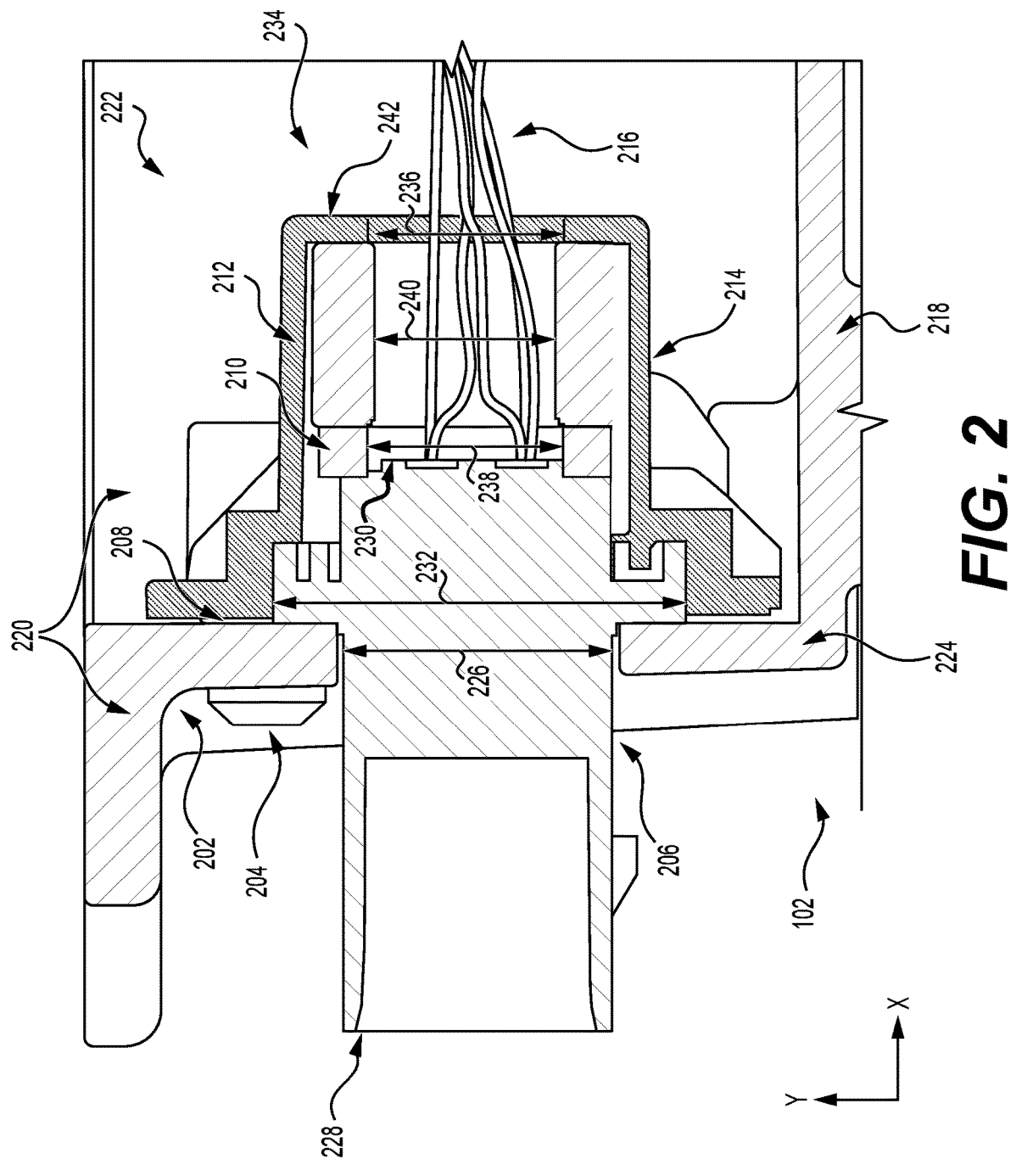
FIG. 2 depicts a cross-sectional view of an exemplary inverter housing with the header subassembly connected, according to one or more embodiments.

FIG. 2 shows an integrated header sub-assembly according to one or more embodiments. FIG. 2 additionally includes an XY coordinate reference plane; the reference plane is solely for exemplary purposes to assist in the detailed description below and is not meant to be limiting.

Header sub-assembly 234, and therefore, traction inverter 102, may include header 206, seal 208, spacer 210, ferrite choke 212, bracket 214, and wiring 216. Header sub-assembly 234 may be fastened to inverter housing 202 by fastener 204 in one or more locations. Inverter housing 202 may include a base 218 and side walls 220 that extend away from the base. The base 218 and side walls 220 at least partially enclose an interior volume 222 of the inverter housing 202. In this way, side walls 220 form a periphery around an interior of the inverter housing 202. At least one of side wall 224 includes an opening 226 extending through the side wall 224. Header 206 may include a body that has a first end 228, a second end 230, and a flange 232. The first end 228 of header 206 may extend through the opening 226 of inverter housing 202, and may be positioned exterior to the traction inverter 102, to connect exterior electrical components (not shown in FIG. 2) to traction inverter 102. More specifically, first end 228 may connect a low-voltage electrical system to traction inverter 102. The flange 232 of header 206 may be coupled to and positioned directly against an inner surface of side wall 224 of inverter housing 202 so that a portion of the header 206 that includes the second end 230 is positioned within the interior volume 222 of the inverter housing 202. In other words, flange 232 may abut side wall 224.

One or more of fastener 204 may secure the header sub-assembly to the inverter housing 202. Seal 208 may be used to further secure fastener 204 to inverter housing 202. Use of seal 208 may provide numerous advantages, including protecting internal components from environmental factors, preventing corrosion, managing thermal conditions, reducing noise and/or vibration, increasing safety, improving efficiency of the inverter, enhancing reliability of the components, extending the life of the components, or any other advantage known to one skilled in the art. For example, seal 208 may be a liquid-tight seal. Fastener 204 may be a machine screw, such as an M4 screw or another suitable screw, according to one or more embodiments. Fastener 204 may couple bracket 214 directly to an inner surface of side wall 224 of inverter housing 202 as shown in FIG. 2, or one of the side walls 220. According to different embodiments not illustrated, fastener 204 may couple bracket 214 to an inner surface of a side wall 224 of inverter housing 202 through a portion of header 206. For example, fastener 204 may extend through a side wall 224 of inverter housing 202, then through the flange 232 of header 206, and then at least partially through bracket 214.

Bracket 214 may be disposed entirely in the interior volume of inverter housing 202. According to one or more embodiments, the portion of header sub-assembly 234 positioned in the interior volume 222 is disposed inside of bracket 214. The bracket 214 may be manufactured in a way that creates a tight, and secure, housing for the portion of header sub-assembly 234 positioned in the interior volume 222. Creating a tight housing helps reduce vibration and increase the durability of the header sub-assembly 234. The bracket 214 may further include a channel 236. Additionally, spacer 210 may include channel 238 and ferrite choke 212 may include channel 240 that are both in communication with the channel 236 so that wiring 216 can pass through from the header 206 through channels 238, 240, and 236 to terminal block connector 302 (shown in FIG. 3). Thus, wiring 216 connects to the inverter control board, which connects the power electronics to the inverter. Channels 236, 238, and 240 may be fully or partially aligned.

Spacer 210 may be disposed between header 206 and ferrite choke 212. Spacer 210 may be fixed relative to the inverter housing 202, header 206, bracket 214, and ferrite choke 212. According to one or more embodiments, the spacer 210 is in direct contact with both the header 206 and the ferrite choke 212 so that it completely fills a gap between the two in the x-direction, as shown in FIG. 2. The spacer 210 may be at least 3 mm thick in the x-direction. In different embodiments, the spacer 210 may be no more than 10 mm thick in the x-direction. The spacer 210 may be between 5 and 7 mm thick. Preferably, spacer 210 is made of a material to help dampen, and reduce, vibration. In some embodiments, spacer 210 is made out of metal. For example, the spacer 210 may be made out of stainless steel or aluminum. According to one or more embodiments, spacer 210 is made out of a foam material. For example, the spacer 210 may be made out of polyurethane, silicone, rubber, cork, sorbothane, or urethane. The spacer 210 may be fully enclosed in the circumferential direction so a channel may pass through the middle of it. The spacer 210 may be substantially cylindrical. Spacer 210 may be a stadium shape. Spacer 210 may be substantially rectangular. Spacer 210 may be substantially rectangular with rounded edges. Spacer 210 may take the shape of any known geometry (either listed or not listed) to effectively fill a gap between header 206 and ferrite choke 212. As described above, wiring 216 may extend through the channel of spacer 210.

Ferrite choke 212 is positioned between the spacer 210 and the inner surface of the end side 242 of bracket 214 that is extending into the inverter housing 202 and facing the opening 226, as shown in FIG. 2. Ferrite choke 212 may be fixed relative to the inverter housing 202, header 206, bracket 214, and spacer 210. Ferrite choke 212 may be any type of choke known in the art and is not limited to a ferrite choke. Embodiments of the present disclosure may omit the use of a spacer. Thus, in these embodiments, ferrite choke 212 is positioned between header 206 and the inner surface of the end side 242 of bracket 214. According to one or more embodiments, ferrite choke 212 is substantially thicker in the x-direction than spacer 210. The ferrite choke 212 may be at least 12 mm thick in the x-direction. In different embodiments, the ferrite choke 212 may be no more than 20 mm thick in the x-direction. The ferrite choke 212 may be fully enclosed in the circumferential direction to properly function as a shield. Ferrite choke 212 creates channel 240 that is enclosed and passes through the middle of ferrite choke 212. As described above, wiring 216 may extend through channel 240 of ferrite choke 212. The position and shape of ferrite choke 212 may significantly improve EMC performance when compared to headers without the discussed integrated header sub-assembly 234. This is achieved by ferrite choke 212 shielding EMI leakage from the wiring 216 and the connection between header 206 and inverter housing 202. As is well understood in the art, ferrite chokes provide a high impedance that suppresses electromagnetic noise at a relatively low cost compared to other EMI shields. Thus, it will be appreciated that ferrite choke 212 suppresses the electromagnetic noise generated from the electrical components described.

Figure 3:
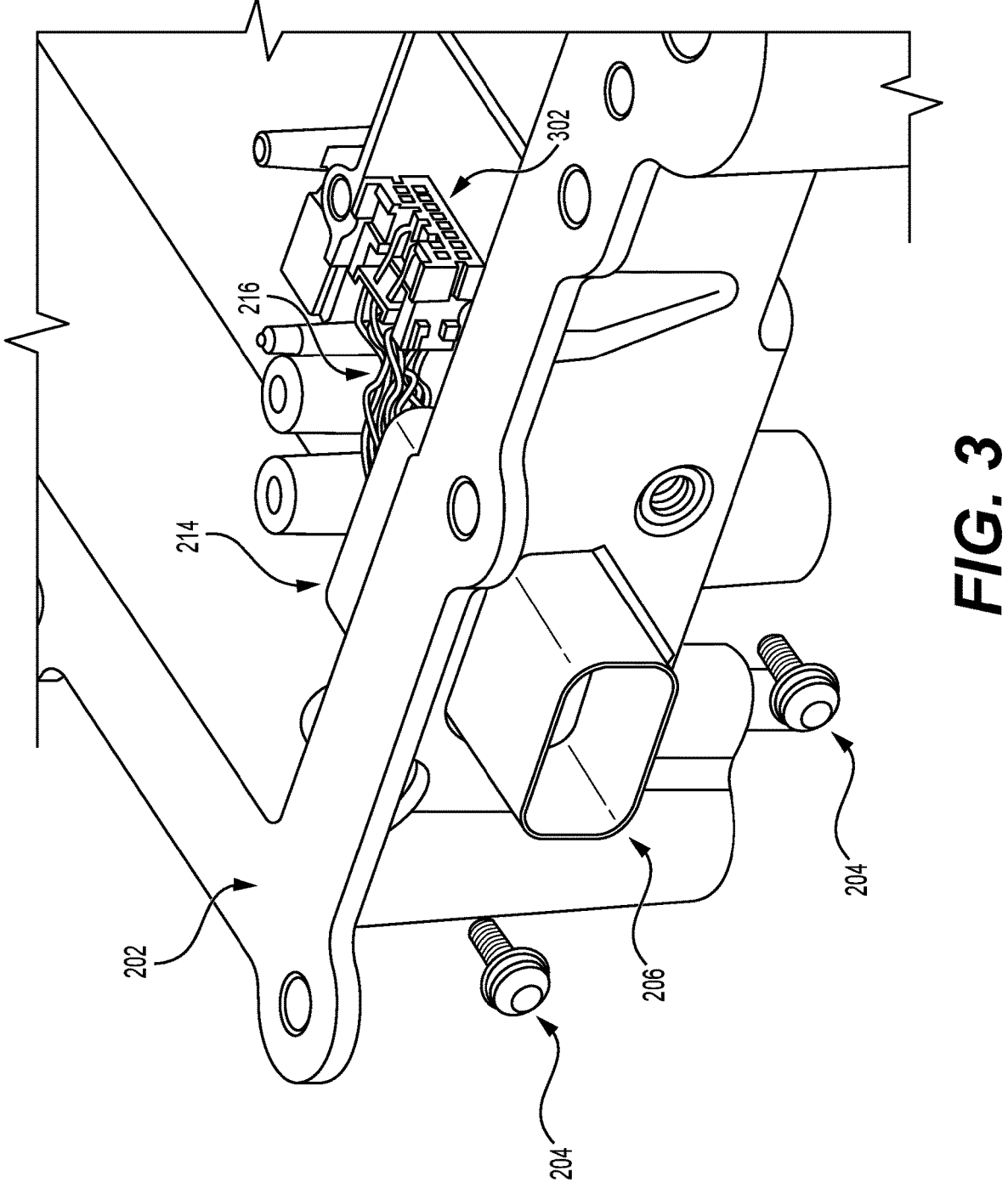
FIG. 3 depicts a perspective view of an exemplary inverter housing with the header subassembly connected, according to one or more embodiments.

FIG. 3 shows integrated header sub-assembly 234 according to one or more embodiments in a perspective view. As shown in FIG. 3, there may be more than one of fastener 204 that secures the header sub-assembly 234 to the inverter housing 202. Header 206 (and the rest of header sub-assembly 234) may be positioned in the bottom half of the inverter housing 202 (as shown) or positioned in the top half of the inverter housing 202 (not shown). It should be understood that the integrated header sub-assembly 234 can easily attach to inverter housing 202 wherever the opening 226 is for the header 206 and should not be limited to the exemplary embodiments shown in the figures.

Figure 4:
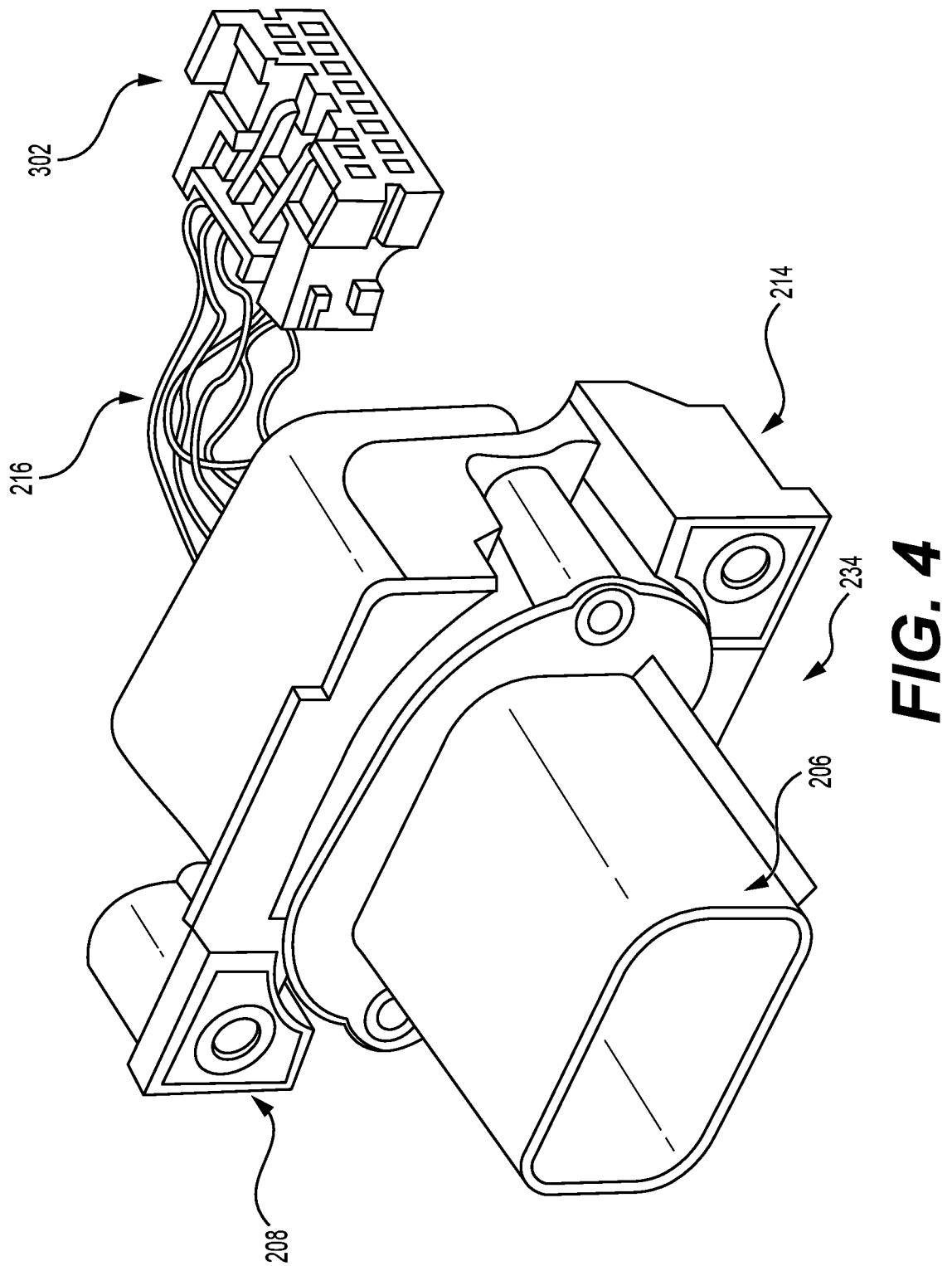
FIG. 4 depicts a perspective view of an exemplary header subassembly, according to one or more embodiments.

FIG. 4 shows an exemplary embodiment of the integrated header sub-assembly assembled without the traction inverter 102. As can be readily seen, the design of the header sub-assembly 234 is a purposefully compact design to conserve space. According to one or more embodiments, the header sub-assembly 234 is designed so that the end side 242 (shown in FIG. 2) of bracket 214 does not extend substantially past the second end 230 (shown in FIG. 2) of header 206. One or more of seal 208 may be disposed in a form-fitting cavity of the bracket 214 (as shown in FIG. 4)

to further conserve space and reduce the extension of the bracket 214 into inverter housing 202.

Figure 5:
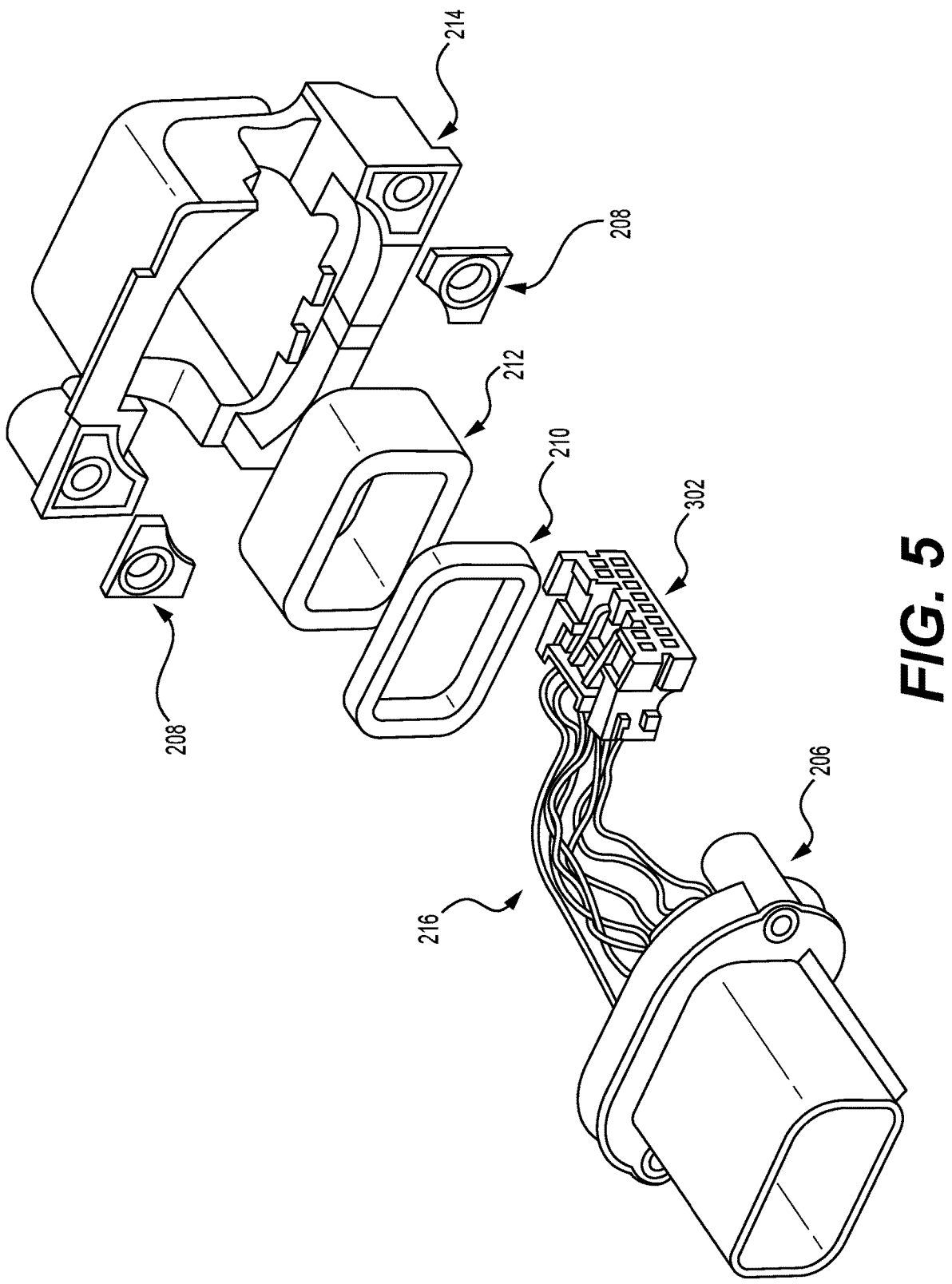
FIG. 5 depicts an exploded view of FIG. 4.

FIG. 5 shows an exploded-view of the exemplary embodiment shown in FIG. 4. It can be readily seen that spacer 210 and ferrite choke 212 may be partially surrounded by bracket 214 to conserve even more space inside of inverter housing 202.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An inverter assembly comprising:
   a housing having a base and a plurality of side walls extending away from the base, wherein a first side wall of the plurality of side walls includes an opening extending through the first side wall, and wherein the plurality of side walls form a periphery around an interior of the housing;
   a header with a body, the body having a first end and a second end, wherein the body further includes a flange disposed between the first end and the second end, and wherein a portion of the body extends through the opening such that the flange abuts the first side wall;
   a bracket positioned within the interior of the housing, and wherein the bracket is coupled to an inner surface of the housing;
   a choke, wherein the choke is positioned within the bracket and against an inner surface of the bracket facing the opening, and wherein the choke is fully enclosed in a circumferential direction of the choke by the bracket along an entire axial length of the choke; and
   a spacer positioned between the header and the choke at the second end of the body of the header, wherein the spacer is fully enclosed in a circumferential direction of the spacer by the bracket along an entire axial length of the spacer.

2. The inverter assembly of claim 1, wherein the choke has an enclosed channel extending through the choke.

3. The inverter assembly of claim 1, wherein the coupling between the bracket and the inner surface of the housing includes a seal.

4. The inverter assembly of claim 1, wherein the bracket is coupled to the inner surface of the housing at more than one location.

5. The inverter assembly of claim 4, wherein each coupling is coupled by an M4 screw.

6. The inverter assembly of claim 1, wherein the inverter assembly further comprises a spacer that is disposed between the header and the choke, and wherein the spacer is fully enclosed in the circumferential direction.

7. The inverter assembly of claim 6, wherein the spacer comprises a foam material.

8. The inverter assembly of claim 6, wherein the spacer has an enclosed channel extending through the spacer.

9. The inverter assembly of claim 6, wherein the spacer directly contacts the header and the choke.

10. The inverter assembly of claim 6, wherein the choke is fixed relative to the housing, header, bracket, and spacer.

11. The inverter assembly of claim 6, wherein the spacer is fixed relative to the housing, header, bracket, and choke.

12. The inverter assembly of claim 6, wherein the choke has an enclosed channel extending through it and the spacer has an enclosed channel extending through it such that the enclosed channel of the choke and the enclosed channel of the spacer are in communication with one another.

13. The inverter assembly of claim 6, wherein the choke has an enclosed channel extending through it, the spacer has an enclosed channel extending through it, and the bracket has a channel extending through it such that the enclosed channel of the choke, the enclosed channel of the spacer, and the channel of the bracket are in communication with one another.

14. The inverter assembly of claim 13, wherein wiring extends from the header through the enclosed channel of the choke, the enclosed channel of the spacer, and the channel of the bracket.

15. The inverter assembly of claim 1, wherein the choke is a ferrite choke.

16. An inverter comprising:
   a housing having a base and a plurality of side walls extending away from the base, wherein a first side wall of the plurality of side walls includes an opening extending through the first side wall, and wherein the plurality of side walls form a periphery around an interior of the housing;
   a header with a body, the body having a first end and a second end, wherein the body further includes a flange disposed between the first end and the second end, and wherein a portion of the body extends through the opening such that the flange abuts the first side wall;
   a bracket positioned within the interior of the housing, and wherein the bracket is coupled to an inner surface of the housing;
   a choke, wherein the choke is positioned within the bracket and against an inner surface of the bracket facing the opening, and wherein the choke is fully enclosed in a circumferential direction of the choke by the bracket along an entire axial length of the choke;
   a spacer positioned between the header and the choke at the second end of the body of the header, wherein the spacer is fully enclosed in a circumferential direction of the spacer by the bracket along an entire axial length of the spacer; and
   power electronics configured to convert direct current to alternating current.

17. The inverter of claim 16, wherein the choke is a ferrite choke.

18. The inverter of claim 16, wherein the choke has an enclosed channel extending through it, the spacer has an enclosed channel extending through it, and the bracket has a channel extending through it such that the enclosed channel of the choke, the enclosed channel of the spacer, and the channel of the bracket are in communication with one another.

19. The inverter of claim 18, wherein wiring extends from the header through the enclosed channel of the choke, the enclosed channel of the spacer, and the channel of the bracket such that the wiring connects the power electronics.

* * * * *